United States Patent [19]

Holford

[11] 4,231,038

[45] Oct. 28, 1980

[54] DOPPLER RADAR DEVICE

[75] Inventor: Kenneth Holford, Crawley, England

[73] Assignee: U.S. Philips Corporation, New York, N.Y.

[21] Appl. No.: 6,063

[22] Filed: Jan. 24, 1979

[30] Foreign Application Priority Data

Feb. 9, 1978 [GB] United Kingdom .............. 05240/78

[51] Int. Cl.³ ............................................ G01S 13/56
[52] U.S. Cl. .................. 343/5 DD; 333/248; 343/5 PD
[58] Field of Search .................... 343/5 DD, 5 PD, 8; 333/103, 248, 258

[56] References Cited

U.S. PATENT DOCUMENTS 3,546,633  12/1970  Peppiatt ............................... 333/103

3,980,974  9/1976  Yamamoto et al. .................. 343/8 X

*Primary Examiner*—T. H. Tubbesing
*Attorney, Agent, or Firm*—Simon L. Cohen

[57] ABSTRACT

A device for indicating whether a target is approaching or receding from a Doppler radar or the like comprising a length of wave-guide having a reflective termination at the end at which microwave energy is introduced into the guide, and two mixer diodes spaced along the guide. The diodes are spaced apart along the guide axis by an odd number of quarter-wavelengths and spaced from the termination by an odd number of eighth-wavelengths. Suitably, the diodes are positioned so as to be loosely-coupled to signals within the guide, thereby rendering the selection of suitable diodes much less critical.

8 Claims, 11 Drawing Figures

DOPPLER RADAR DEVICE

This invention relates to a Doppler radar device of the kind comprising a length of waveguide having a reflective termination at one end and means at that end for introducing microwave energy into the waveguide, two mixer diodes within and spaced apart along the waveguide whereby energy to be transmitted can flow in one direction along the waveguide past the diodes to the other end of the waveguide and return energy reflected from a target can flow past the diodes in the opposite direction. Such a device is described in U.K. Pat. No. 1,482,413.

In such a device having a pair of phase-quadrature mixer diodes to provide sense indication, signal reflections can cause phase-error problems. Such reflections can occur within the device itself, for example due to difficulty with diode matching and due to the reflective termination of the length of waveguide at the end at which energy from the source is introduced into the guide.

This invention provides a novel arrangement based upon a predominantly reflective termination instead of prior arrangements in which an absence of significant reflection is implicit in the design: such a prior arrangement is, for example disclosed in "Direction Sensitive Doppler Device" by H. P. Kalmus, Proc. I.R.E. (USA) June 1955 pages 698–700.

According to the invention there is provided a Doppler radar device of this kind described in the opening paragraph characterized in that the mixer diodes are spaced apart along the axis or the line of centres of the waveguide by a distance $(2n+1)\lambda/4 + \gamma\lambda$ where n is zero or a positive integer, $\lambda$ is the wavelength at the designed operating frequency and $\gamma$ is a factor which compensates for the effect of the diodes on propagation within the waveguide and also is characterized in that the distance along the line of centres of the waveguide between the termination and the mixer diode nearer thereto is substantially $(2m+1).\lambda/8$ wherein m is zero or a positive integer.

In order to produce an appropriate mixer power the diodes may be positioned so as to be loosely coupled to the signals in the waveguide. Such a feature provides a substantial advantage because the diode characteristics themselves become less important to the operation of the device than where the diodes are tightly coupled.

The loose coupling may be effected by positioning the diodes transversely from the line of centres of the guide.

The reflective termination may be a short circuit, a probe being provided to introduce energy into the waveguide.

Alternatively, the reflective termination may be an iris through which energy can be introduced into the waveguide.

Embodiments of the invention will now be described by way of example with reference to the diagrammatic drawings in which.

Figure 1:
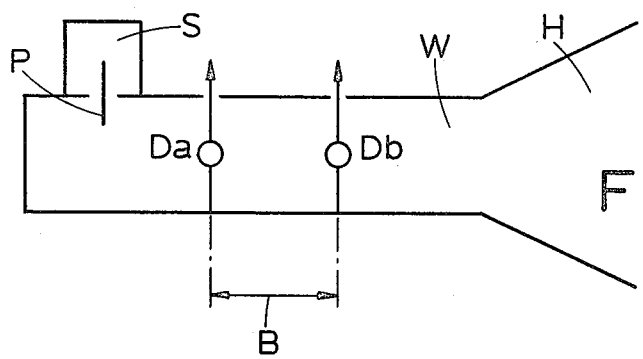
FIG. 1 illustrates a form of device embodying the invention.

Referring now to FIG. 1 a length of waveguide W is coupled to a microwave energy source S, for example a Gunn oscillator, by means of a probe P positioned adjacent one end of the guide which is terminated in a short circuit. The other end of the waveguide is adapted for connection to a horn aerial H; alternatively, the waveguide and aerial may be formed as a single member. Within the waveguide are two mixer diodes Da and Db which are spaced apart along the waveguide by a distance B. Signals developed across the mixer diodes are applied to respective amplifiers in the usual manner and the "sense" of the moving target is derived from the relative phases of the developed and amplified signals.

A spacing B for the diodes in FIG. 1 necessary to obtain quadrature Doppler signals is less simple than would appear. An apparently obvious solution would be to use diodes separated by an odd number of eighth-wavelengths, that is to say $(2n+1)\lambda/8$ where n is zero or a positive integer and this has been the basis of prior proposals. With $\lambda/8$ spacing the mixing power at diode mixer Db is delayed by 45° and the target return signal reaches it 45° earlier. This produces a 90° phase difference for the pair of signals compared to those at mixer Da. If there were no reflection from the termination, this would produce a pair of quadrature Doppler signals.

In practice the portion of the target signal which is not absorbed by the diodes is quite significant, and when this portion is reflected by the termination it is partially absorbed again by the diodes. This demands quite different diode spacing. Investigations leading to the present invention have shown that a suitable spacing is an odd number of quarter-wavelengths, that is to say $(2n+1)\lambda/4$ together with the reflective termination positioned an odd number of eighth-wavelengths, that is to say $(2m+1)\lambda/8$ from the nearest diode, where m is also zero or a positive integer which is quite different from the prior proposals referred to above.

It is convenient at this point to introduce some theoretical analysis. Consider FIG. 1 with diodes Da and Db spaced apart by $\lambda/4$, i.e. n=0, and the field received from the target as being incident upon the first diode, without any regard for the reflection from the termination or for the influence of the diodes upon the field. To draw the vector diagram the target is assumed to be approaching and to have reached a convenient position for the vectors shown in FIGS. 2 and 3. In these diagrams the vectors Va and Vb are considered to be stationary and the angle of the other vectors is dependent upon the target range.

Figure 2:
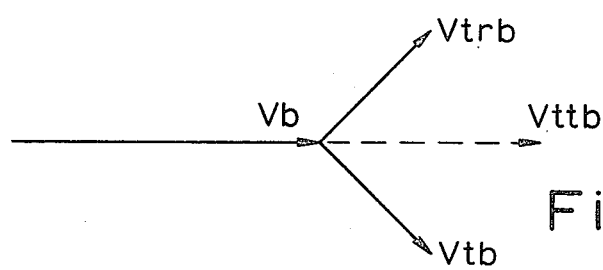
FIGS. 2 and 3 are vector diagrams.

In FIG. 2 the field Vtb due to the target return signal at mixer diode Db is at a position 45° lagging the locally supplied mixing signal Vb at the same mixer. The position of the reflective termination is now chosen such that the signal is reflected back to the mixer with a 90° lead as shown as Vtrb. The resultant sum field from these two vectors is Vttb which is in phase with the local mixing signal Vb. Now since both Vtb and Vtrb will rotate counter-clockwise for further target approach, so does the sum vector Vttb and the effect of the termination is seen to be produce the single vector Vttb.

Figure 3:
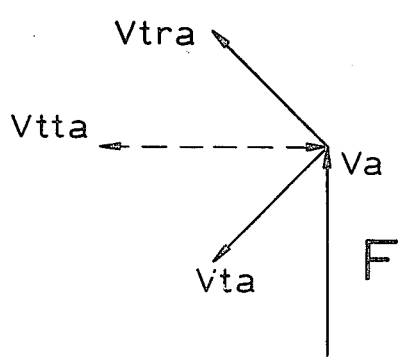

Mixer diode Da is $\lambda/4$ further from the aerial and nearer the reflective termination and by tracing out the path lengths it will be found that a similar mirror-image pair of signals, Vta and Vtra, FIG. 3, are produced at mixer diode Da, so that the resultant vector Vtta at mixer Da is in exact antiphase to the resultant Vttb at mixer Db. Since the locally supplied mixing signals, Va, Vb are in phase quadrature with these at the two mixers the conditions for quadrature Doppler signals has been satisifed. In FIG. 3 the vectors Vta and Vtra also both rotate counter-clockwise as the target approaches.

Quadrature difference between the two Doppler signals will still be produced if the position of the termination is moved in integral steps of $\lambda/2$: this changes the mixing phases by $2\pi$ which results in the same diagram. The termination can also be moved in integral steps of $\lambda/4$: for instance if it is moved by $\lambda/4$ the vector Vtrb at mixer Db is moved by $\lambda/2$ and the sum signal Vttb at mixer Db is vertically downwards. The vector Vtra also moves the sum Vtta at mixer Da is vertically downwards also. This results in quadrature Doppler signals except that the mixer Da which previously produced a signal 90° in advance of that produced by mixer Db now produces a signal with a 90° lag.

If the phase shift caused by the reflecting termination itself is $\lambda/2$, the acceptable termination spacings with ideal diodes is $(2m+1).\lambda/8$ from mixer Da.

Since there is a physical limit as to how close the termination can be to a diode, due to package size the smallest convenient value is usually $3\lambda/8$ from the nearest diode Da. With this spacing and a $\lambda/2$ phase shift at the reflection the vector phases are shown in FIG. 2 and FIG. 3.

For reflections having a phase different from $\lambda/2$ the plane of the reflector should be moved to compensate for the difference.

The spacing between the mixers needs modifying if allowance is made for mixer target-return-signal power absorption. This can be crudely illustrated by assuming a signal passing a diode undergoes a 5% power loss. The vector Vtrb is then shorter by 15% and causes the phase of Vttb to retard by about 5°. Some shortening of vector Vttb also occurs.

At mixer Da Vta is shortened by 5% and Vtra by 10%, causing about 1.5° lead of Vtta. The sum effect is a 6.5° total phase shift in the quadrature mixing. Also Vtta and Vttb are not quite of equal length, that is to say there is some amplitude unbalance but this is small compared to diode spreads and can be easily corrected by gain adjustment to one of the subsequent Doopler amplifiers.

The phase shift due to diode power absorbtion or a lossy termination may be compensated by moving the position of the diodes. If diode Da is moved along the guide towards the termination, that is to say to the left in FIG. 1 and the rest of the mechanics stay the same, Vta in FIG. 3 will shift clockwise and Vtra will shift counter-clockwise in equal amounts. The resultant phase of Vtta is unchanged by this if the vector lengths Vta and Vtra are equal although the magnitude of Vtta will increase, and, incidentally, more nearly equal that at mixer Db. Turning now to the mixing signal itself, Va, it is seen that this moves counter-clockwise by the same amount and has the effect of retarding the mixing and hence the Doppler signal for this mixer.

To correct a 6.5° phase error in the quadrature Doppler signals it is estimated that mixer Da would need moving away from mixer Db by about $6.5(\lambda/263)=\lambda/55$.

Unequal amplitude Doppler signals, for instance due to unequal mixing powers, may be corrected by moving the position of the reflecting termination by a small amount, such as $\lambda/16$ or less.

This alters the included angle between Vtb and Vtrb and also that between Vta and Vtra so that one inclusive angle increases and the other decreases. This alters the magnitudes of the sum vectors Vtta and Vttb. At the same time the change in phase difference between the two Doppler signals is only a second order effect, for small corrections, because both vector Vtta and Vttb are moved in the same direction.

The design of a suitable device thus involves the following considerations:

(a) positioning the diodes along the guide to achieve the correct electrical spacing between them, that is to say spacing them apart by basically an odd number of quarter wavelengths.

(b) positioning the spaced diodes relative to the termination to attain a correct reflection phase and produce roughly equal amplitude Doppler signals, that is to say spacing the termination basically an odd number of eighth wavelengths from the nearest diode.

It would also quite likely be necessary to position the diodes transversely from the line of centres of the guide, so as to produce an appropriate mixer power.

In this connection it is of interest to note that such transverse positioning of the mixer diodes means that they are only loosely coupled to the signals in the guide and this in turn provides a significant advantage because the problems of diode selection and aerial matching are much less critical than in prior proposals, which means that the device as such can be much more adaptable, more easily installed and less expensive.

Figure 4:
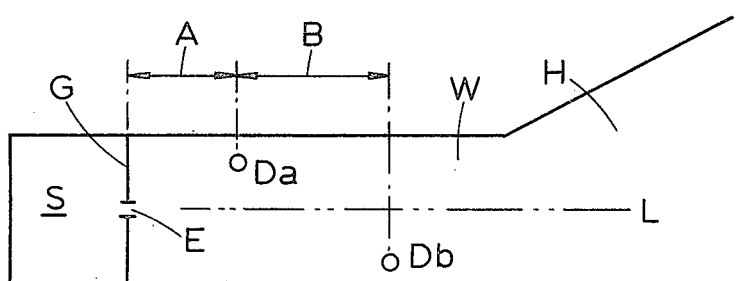
FIG. 4 illustrates a second form of device embodying the invention.

Referring now to FIG. 4 another form of microwave mixer device embodying the invention comprises a length of rectangular waveguide W with a microwave power source S, which again may be a Gunn oscillator, at one end: in operation the source S supplies energy through an iris E in a diaphragm G to an aerial horn H. Signal reflection now occurs at the iris. Between the iris and the horn are two mixer diodes Da and Db again spaced along the waveguide by a distance B and the diodes also are offset from the centre-line L of the guide in order to keep their power absorption down to a low level, for example half a milliwatt. Thus with a 10 mW power source only one twentieth would be intercepted by the diodes and using reciprocity only one twentieth of the aerial signal power would be absorbed by each diode, except that the remaining power is reflected again by the iris and on its return will alter the field in the vicinity of the diodes. With an iris spacing from the nearest diode equal to an odd number of eighth-wavelengths, as described earlier for the termination, the signal power absorbtion can be expected to increase to twice the fraction of one twentieth of the example above. In other words each diode will absorb about one tenth of the signal power entering the aerial.

The iris E is spaced from the nearest mixer diode Da by a distance A in FIG. 4. If this spacing distance is small compared with a guide wavelength the spacing may appear not to conform with the simple waveguide theory, because of insufficient length for a wavelength type of wave to become established. During experiments to check the theoretical predictions the iris was spaced off with a phase shifter by several half-wavelengths so that the diode interspacing could first be evaluated under more ideal conditions. A close position for the iris was later determined.

Figure 5:
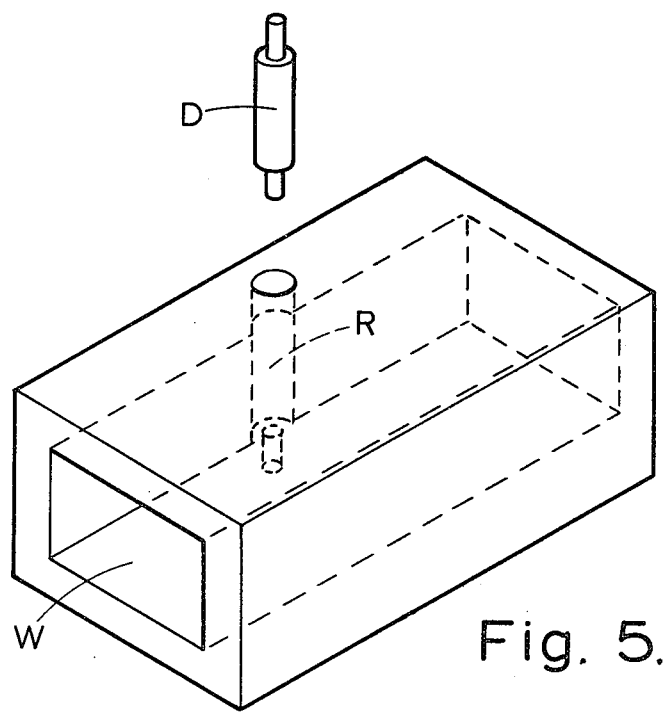
FIG. 5 illustrates a diode positioning arrangement.

The frequency of 10.59 GHz and WG16 waveguide, which is the equivalent of US(EIA) WR90 and IEC R100, was used. Each diode D was type BAV 46 mounted in a recess R in the wall of the waveguide as shown in FIG. 5.

Figure 6:
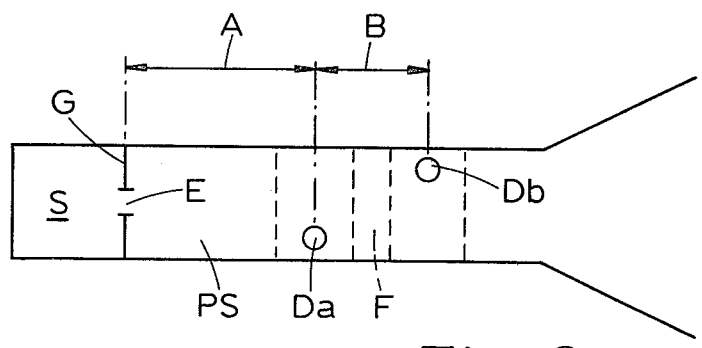
FIG. 6 illustrates a test arrangement.

The schematic diagram of the test rig is shown in FIG. 6. Two waveguide sections each containing a diode are spaced apart with a fillet F. A well matched horn aerial H was fitted at one end of the assembly and pointed at a moving target. The opposite end of the waveguide housed a 12 mW Gunn power source S separated from an adjustable phase shifter PS by diaphragm G having an iris E.

A theoretical spacing of the diodes of $\lambda/4 + \lambda/55$ at 10.59 GHz is 9.67 mm. This however ignores any wave disturbance caused by the ceramic encapsulation in which each diode is housed and which had a 5.8 mm diameter and a 1.2 mm wall thickness with a dielectric constant of about 10. The total spacing, along the guide, between the diodes may be represented by the expression $(2n+1)\lambda/4 + \gamma\lambda$ where $\gamma$ is a factor representing the phase shift caused partly by the diode power absorption of the return signal and partly by the effect of the diode encapsulation. In practice, $\gamma$ may vary from zero to 0.08 but usually will tend to lie between 0.03 and 0.05.

Diode spacings of 9, 10 and 10.8 mm were compared. The quality of the mixing was conveniently evaluated by observing a Lissajou figure derived by applying the output signal from one diode to the X plates and the other to the Y plates of an oscilloscope. For comparison other Lissajou figures were available having a known phase error of 0°, 5°, 10° and 15°.

From 30 diode samples a pair were selected as being average in terms of the Lissajou figure produced and also in capacitance which was 0.3 pF when measured at 1 MHz on a Boonton Model 72B capacitance meter, and these two diodes were used to assess the effects of different spacings.

The diode DC bias was typically 250 to 300 mV DC when shunted with a 1 k.ohm resistor which provides self-bias current. All experiments were on this basis.

Two of the spacings 10.0 and 10.8 mm showed results, having phase errors of generally not worse than 10° not only with the selected pair of diodes but also with other pairs of diodes and it was concluded that the ideal spacing was close to 10 mm. Several pairs of diodes with the 10 mm spacing produced signals with less than 5° error and 80% of the samples were found to be usable if the tolerance was set at ±10°. As a quarter guide-wavelength is approximately 9 mm., the extra spacing being used to allow for the phase shifts caused in the main by diode power absorption and by the housings of the diodes is about 1 mm with the diode spacing of 10 mm and about 1.8 mm with the diode spacing of 10.8 mm, yielding approximate values for the factor $\gamma$ of 0.028 say 0.03 and 0.056 say 0.06 respectively. Since theoretically 9 mm corresponds with 90° of phase, 1 mm change in spacing represents 10°.

The 10 mm and 10.8 mm spacings were used to find the best distance for the iris from diode Da when this was close to the diodes. For a diode spacing of 10 mm this was found to be 14.5 mm and for a diode spacing of 10.8 mm was found to be 13.8 mm. With the sample batch of 30 diodes used, the 10.8 mm spacing gave less phase error with the close iris and the 10 mm spacing with the distant iris.

The distances quoted are measured along the line of centres of the guide with no account for lateral displacement. The valve $3\lambda/8$ works out to be 13.52 mm in guide wavelength terms but it is difficult to compare this with the spacings of 14.5 and 13.8 mm quoted above because of the lateral distance across the guide and the short distances involved which tend to introduce measurement uncertainties. Also, as pointed out earlier slight deviations from ideal compensate for unequal amplitude Doppler signals.

Rectangular waveguides have been used in the descriptive work shown in this disclosure but is should be understood that other shapes of waveguide may also be used. As waveguide sizes and shapes are changed the wavelength in the guide changes and the design can be appropriate to the guide being used.

Figure 8:
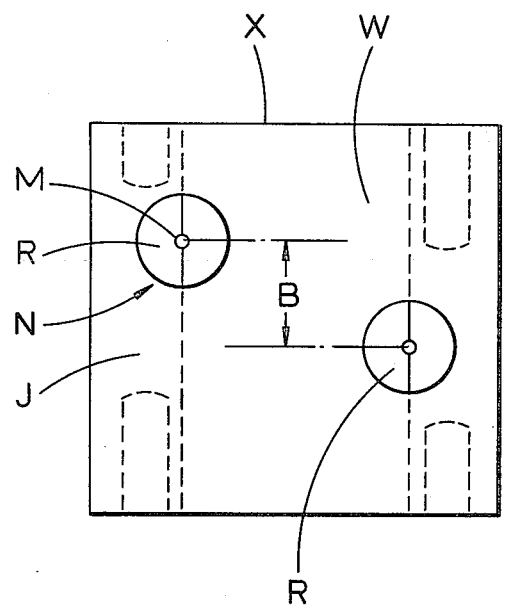
FIGS. 7 to 11 illustrate in greater detail another embodiment.
Figure 7:
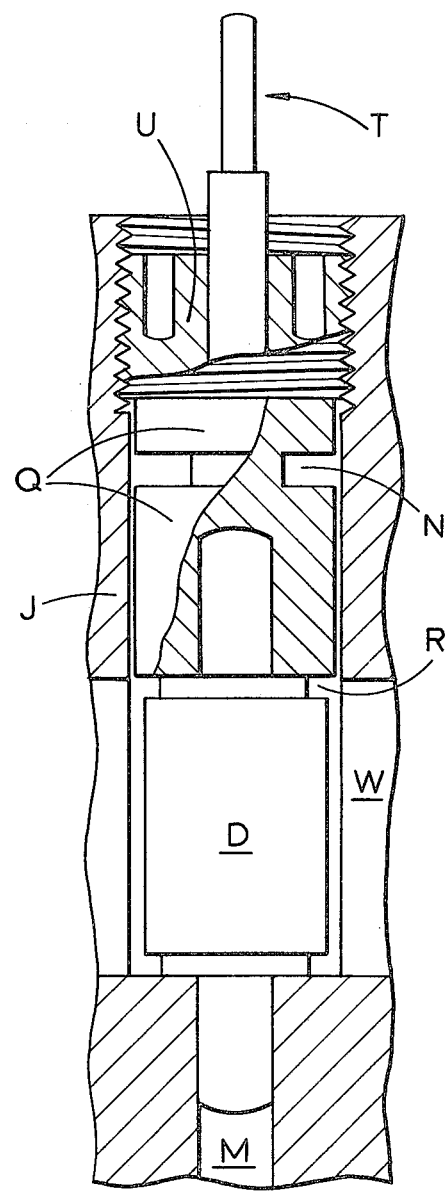
Figure 9:
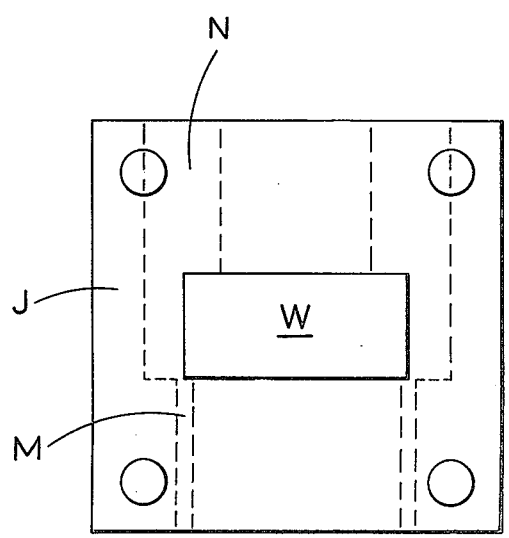

Referring now to the embodiment illustrated in FIGS. 7 to 11, FIG. 7 illustrates in greater detail the manner in which each of the diodes D is mounted within a recess R in the wall of the waveguide W which in this embodiment is formed in a metal block J. As viewed in FIG. 7 a lower terminal of the diode fits into a bore M in the lower part of the block J whilst the other, upper diode terminal extends into a bore N. A choke Q fits closely around this upper terminal but is insulated from direct connection with the wall of the bore N by an insulating covering not shown. The choke is formed with an upper part T which serves as a terminal for connection to an external amplifying and indicating circuit and the choke is held firmly in bore N by a choke-fixing screw U of insulating material such as polytetrafluorethelene (PTFE). FIGS. 8 and 9 are respectively a plan view and an end view of the block J, without the diodes fitted, the end face X of the block being that which is connected to the power source, not shown.

Figure 10:
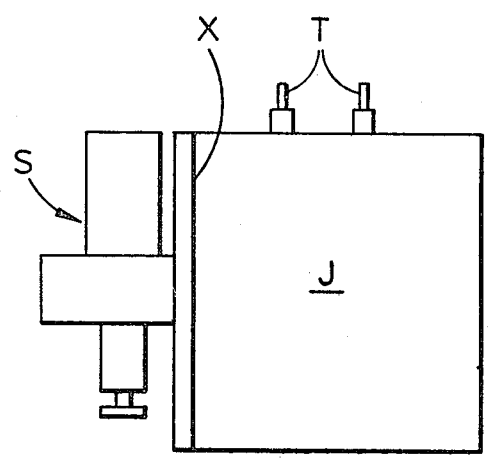

FIG. 10 illustrates the assembly of block J with choke terminals T and power source S which in this embodiment is a Gunn oscillator of the MA-86651 series made by Microwave Associates.

Figure 11:
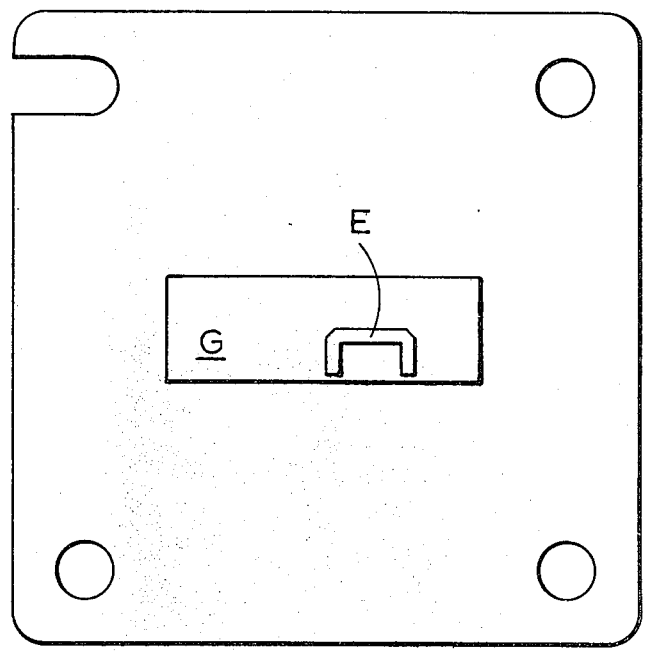

FIG. 11 illustrates the end face of the oscillator which mates with face X of the block and which is formed with an iris E in a diaphragm G: the iris may, of course have a shape other than that illustrated, provided that power source acts as a reflective termination for received energy incident upon it.

In this embodiment the distance B, see FIGS. 6 and 8, was 10.8 mm and the distance A, see FIG. 6, was 13.8 mm. The operating frequency was 10.587 GHz with a guide wavelength of substantially 36 mm so that the expression for B, that is to say $(2n+1).\lambda/4 + \gamma\lambda$, becomes $\lambda/4 + 0.05\lambda$, with n equal to zero: the expression for A, that is to say $(2m+1).\lambda/8$ becomes $3\lambda/8$ with m equal to unity.

In this construction various modifications may of course be made to suit particular circumstances. For example, the iris E may be of different shape such as circular or rectangular and a different type or disposition of diode may be used.

Again, although the diodes are shown as being one on each side of the waveguide, so as to approach a more symmetrical configuration, such a feature is not an essential and in certain circumstances, for example where mechanical considerations render it desirable, the diodes may both be on the same side of the waveguide.

I claim:

1. Apparatus for use in a Doppler radar or the like comprising a length of waveguide having a reflective termination at one end, means at said one end for introducing microwave energy into the waveguide and two mixer diodes arranged within and spaced apart along the waveguide so that energy to be transmitted can flow in one direction along the waveguide past the diodes to the other end of the waveguide and return energy reflected from a target can flow past the diodes in the opposite direction, the mixer diodes being spaced apart along the axis of the waveguide by a distance $(2n+1)\lambda/4 + \gamma\lambda$ where n is zero or a positive integer, $\lambda$ is the wavelength at the designed operating frequency and $\gamma$ is a factor which compensates for the effect of the diodes on propagation within the guide and wherein the distance along the axis of the waveguide between the termination and the mixer diode nearer thereto is substantially $(2m+1).\lambda/8$ where m is zero or a positive integer.

2. The apparatus as claimed in claim 1 wherein the diodes are positioned so as to be loosely coupled to the signals in the waveguide.

3. The apparatus as claimed in claim 2 wherein the diodes are positioned transversely from the axis of the waveguide.

4. The apparatus as claimed in any preceding claim wherein the termination is a short circuit and said means includes a probe for introducing energy into the waveguide.

5. The apparatus as claimed in any of claims 1, 2 or 3 wherein the termination is an iris through which energy can be introduced into the waveguide.

6. A device as claimed in claim 1 wherein $\gamma$ is not more than 0.08.

7. A device as claimed in claim 1 wherein m=2.

8. A device as claimed in claim 1 wherein n=0.

* * * * *